United States Patent
Han et al.

(10) Patent No.: US 10,997,714 B2
(45) Date of Patent: May 4, 2021

(54) APPARATUS FOR INSPECTING COMPONENTS MOUNTED ON PRINTED CIRCUIT BOARD, OPERATING METHOD THEREOF, AND COMPUTER-READABLE RECORDING MEDIUM

(71) Applicant: KOH YOUNG TECHNOLOGY INC., Seoul (KR)

(72) Inventors: Seung Bum Han, Seoul (KR); Filip Lukasz Piekniewski, San Diego, CA (US); Dae Sung Koo, Seoul (KR); Woo Young Lim, Goyang-si (KR); Jin Man Kang, San Diego, CA (US); Ki Won Park, Gwangmyeong-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 85 days.

(21) Appl. No.: 16/485,645

(22) PCT Filed: Feb. 13, 2018

(86) PCT No.: PCT/KR2018/001902
§ 371 (c)(1),
(2) Date: Aug. 13, 2019

(87) PCT Pub. No.: WO2018/147712
PCT Pub. Date: Aug. 16, 2018

(65) Prior Publication Data
US 2019/0362482 A1 Nov. 28, 2019

Related U.S. Application Data

(60) Provisional application No. 62/458,166, filed on Feb. 13, 2017.

(51) Int. Cl.
*G06T 7/00* (2017.01)
*G06N 20/00* (2019.01)

(52) U.S. Cl.
CPC ............ *G06T 7/001* (2013.01); *G06N 20/00* (2019.01); *G06T 7/97* (2017.01); *G06T 2200/04* (2013.01); *G06T 2207/30141* (2013.01)

(58) Field of Classification Search
CPC ............... G06N 20/00; G06T 2200/04; G06T 2207/20081; G06T 2207/20084;
(Continued)

(56) References Cited

U.S. PATENT DOCUMENTS 5,991,435 A * 11/1999 Tsujikawa ............. G06T 7/0006
348/126
2004/0184031 A1 9/2004 Vook et al.
(Continued)

FOREIGN PATENT DOCUMENTS

CN 1834630 9/2006
CN 101506616 8/2009
(Continued)

OTHER PUBLICATIONS

Extended Search report corresponding to European Application No. 18751183.7, dated Dec. 17, 2019.
(Continued)

*Primary Examiner* — Kim Y Vu
*Assistant Examiner* — Michael J Vanchy, Jr.
(74) *Attorney, Agent, or Firm* — Kile Park Reed & Houtteman PLLC

(57) ABSTRACT

An apparatus for inspecting components may include a processor for: determining exterior information of a first component mounted on a first printed circuit board; inspecting a mounting state of the first component by using inspection information of a second component having a first similarity value, when the first similarity value is higher than or equal to a preset reference similarity value, and updating
(Continued)

the inspection information of the plurality of components by using the inspection information of the first component matched with the inspection information of the second component, when it is determined that the mounting state of the first component is good.

17 Claims, 9 Drawing Sheets

(58) Field of Classification Search
CPC . G06T 2207/30141; G06T 7/001; G06T 7/97; G06T 2207/30152; G06T 2207/10016; G06T 2207/10152; G06T 2207/30148; G06T 7/0002; G06T 7/521; G06T 7/55; G06T 7/586; G06T 7/60; G06T 7/62; H05K 13/08; H05K 13/0817; H05K 13/083; H05K 1/0269; H05K 3/3485; G01B 11/24; G01B 11/2527; G01N 21/00; G01N 21/95684; G01R 31/2805; G05B 19/41875; G05B 2219/37217; G05B 2219/45026; Y02P 90/02; Y02P 90/04; Y02P 90/22

See application file for complete search history.

(56) References Cited

U.S. PATENT DOCUMENTS

2006/0257015 A1* 11/2006 Katahata .................. G06T 7/001
382/145

| | | | |
|---|---|---|---|
| 2010/0165094 A1 | 7/2010 | Kakuda et al. | |
| 2012/0194647 A1 | 8/2012 | Tomaru | |
| 2014/0125375 A1* | 5/2014 | Lee ................... G01R 31/2805 | |
| | | | 324/763.01 |

FOREIGN PATENT DOCUMENTS

| | | |
|---|---|---|
| EP | 1 703 465 | 9/2006 |
| JP | 2004-340832 | 12/2004 |
| JP | 2008-157749 | 7/2008 |
| JP | 2009-168582 | 7/2009 |
| JP | 2012-159397 | 8/2012 |
| KR | 10-2014-0058317 | 5/2014 |
| WO | 01/43521 | 6/2001 |

OTHER PUBLICATIONS

The PCT Written Opinion with English Translation of the International Searching Authority of the corresponding International Application No. PCT/KR2018/001902 dated May 23, 2018.
The International Search Report of the corresponding International Application No. PCT/KR2018/001902 dated May 23, 2018.
Chinese Office Action, with English translation, corresponding to Chinese Application No. or Publication No. 201880011381.X, dated May 29, 2020.

* cited by examiner

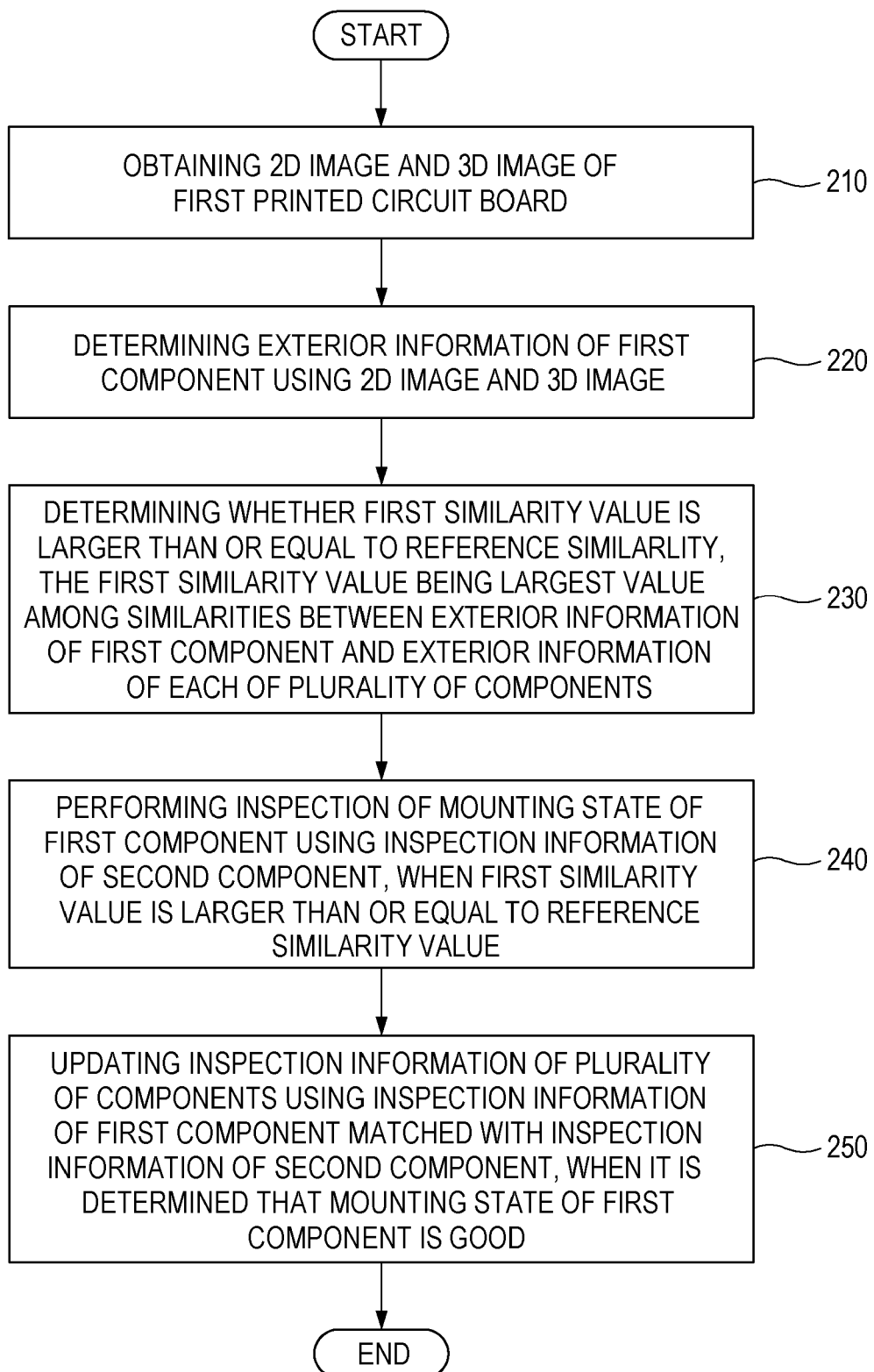

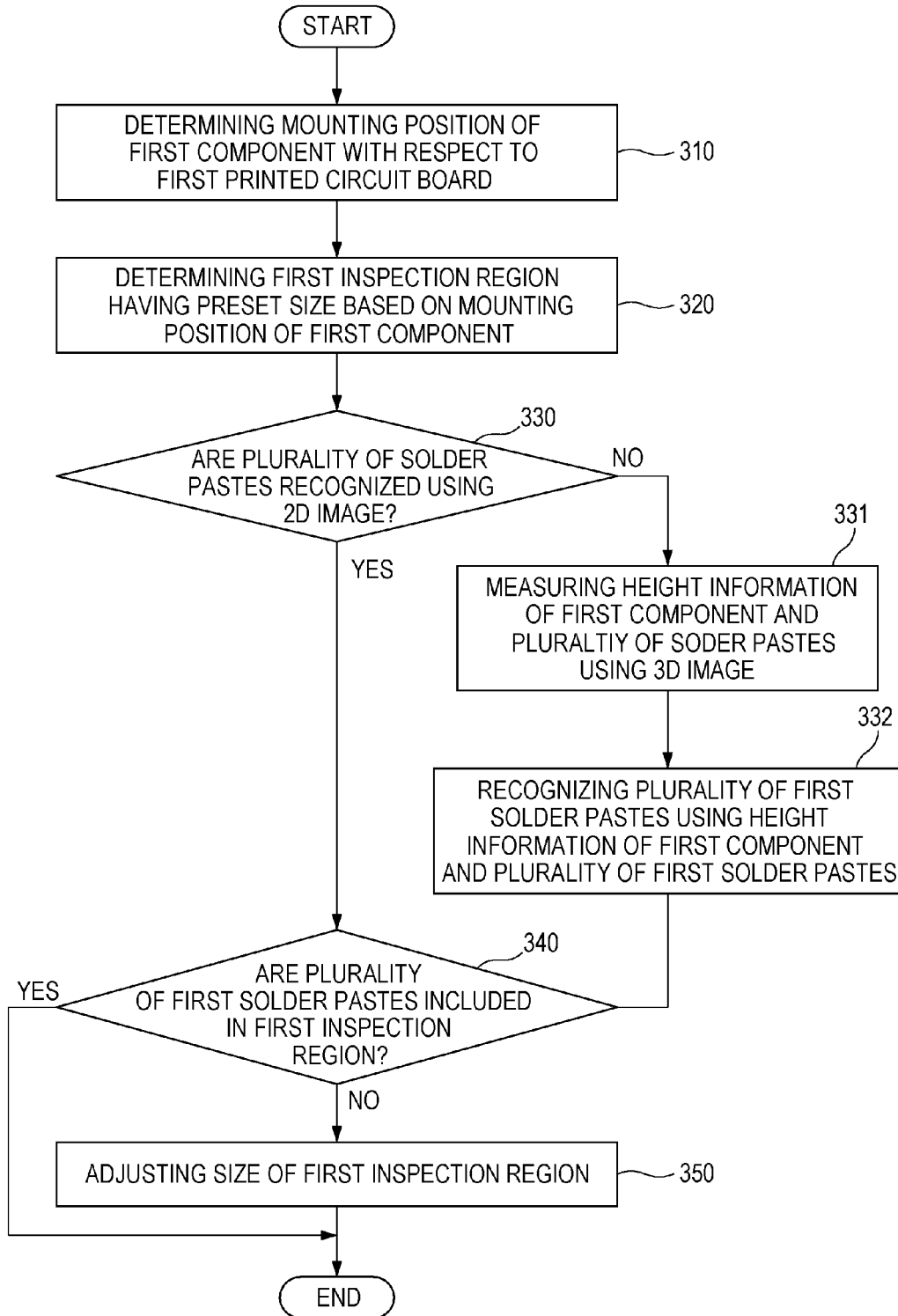

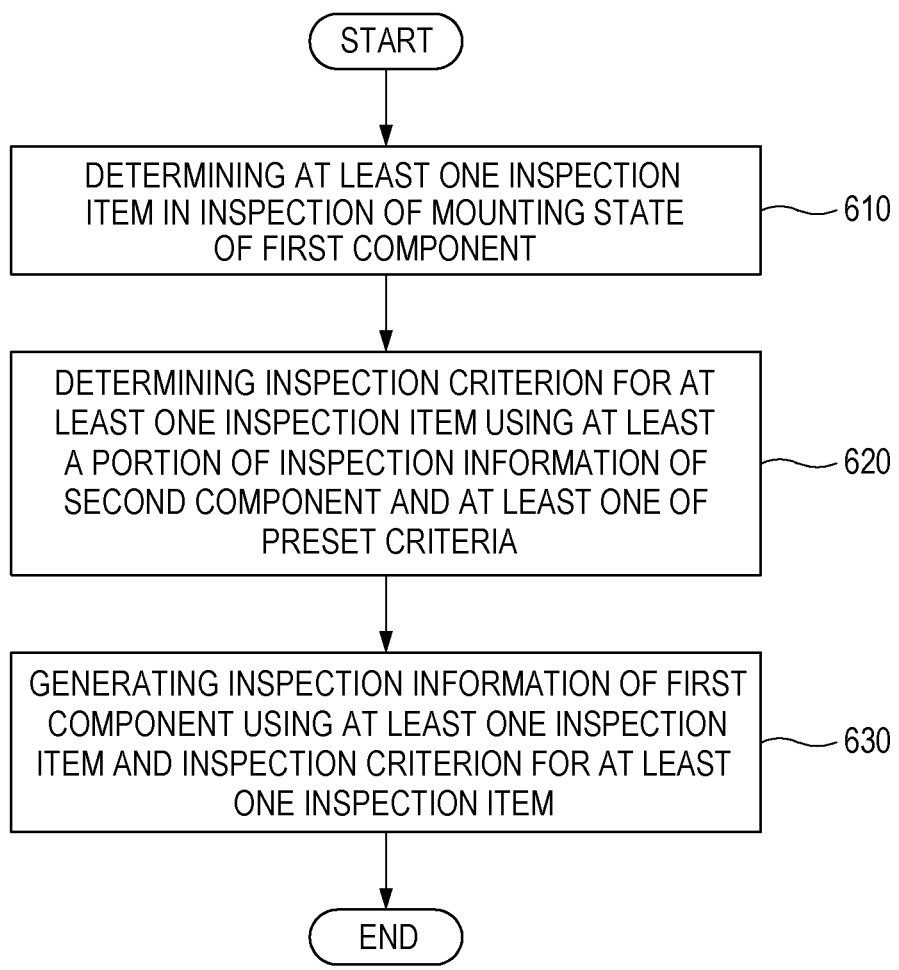

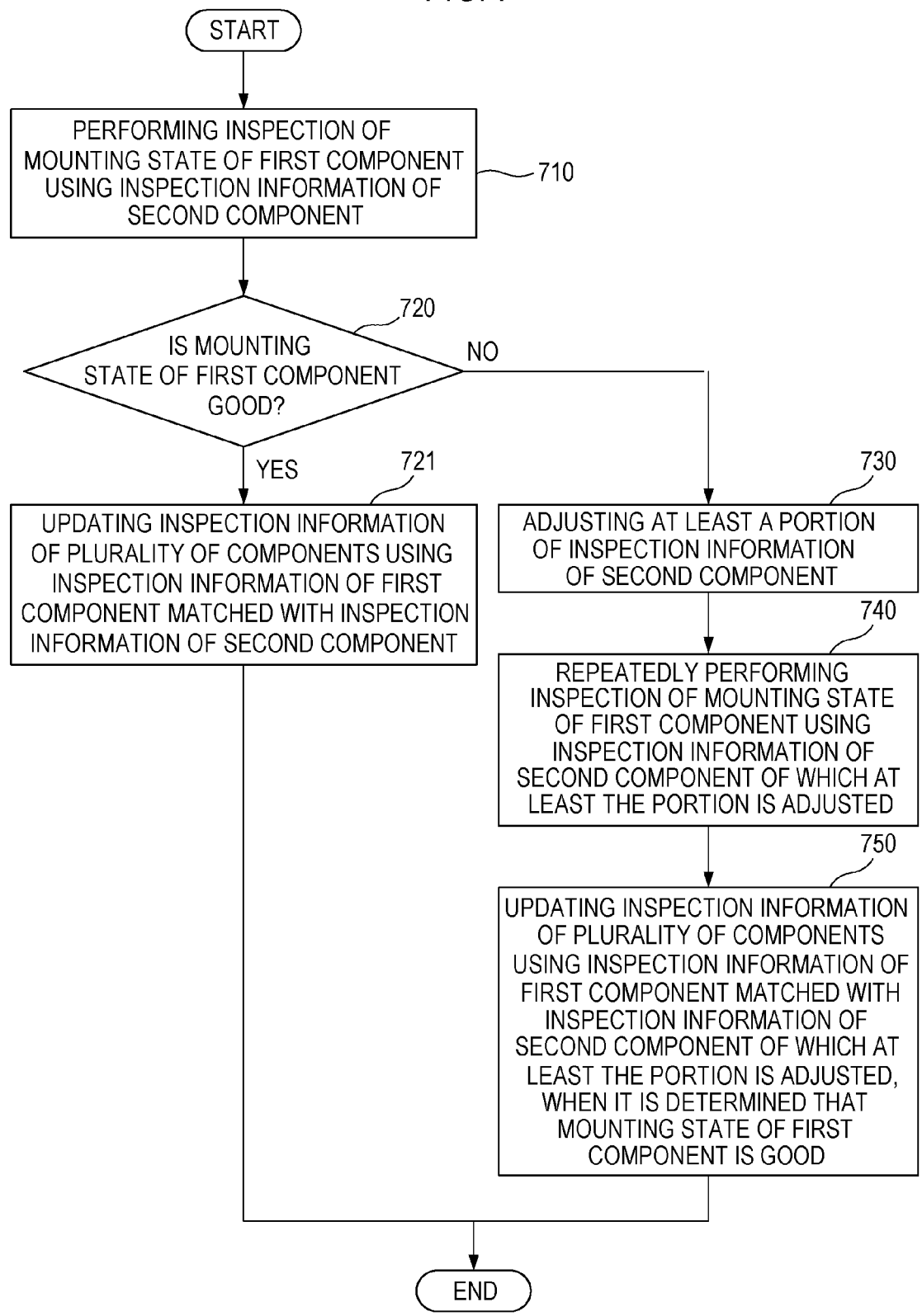

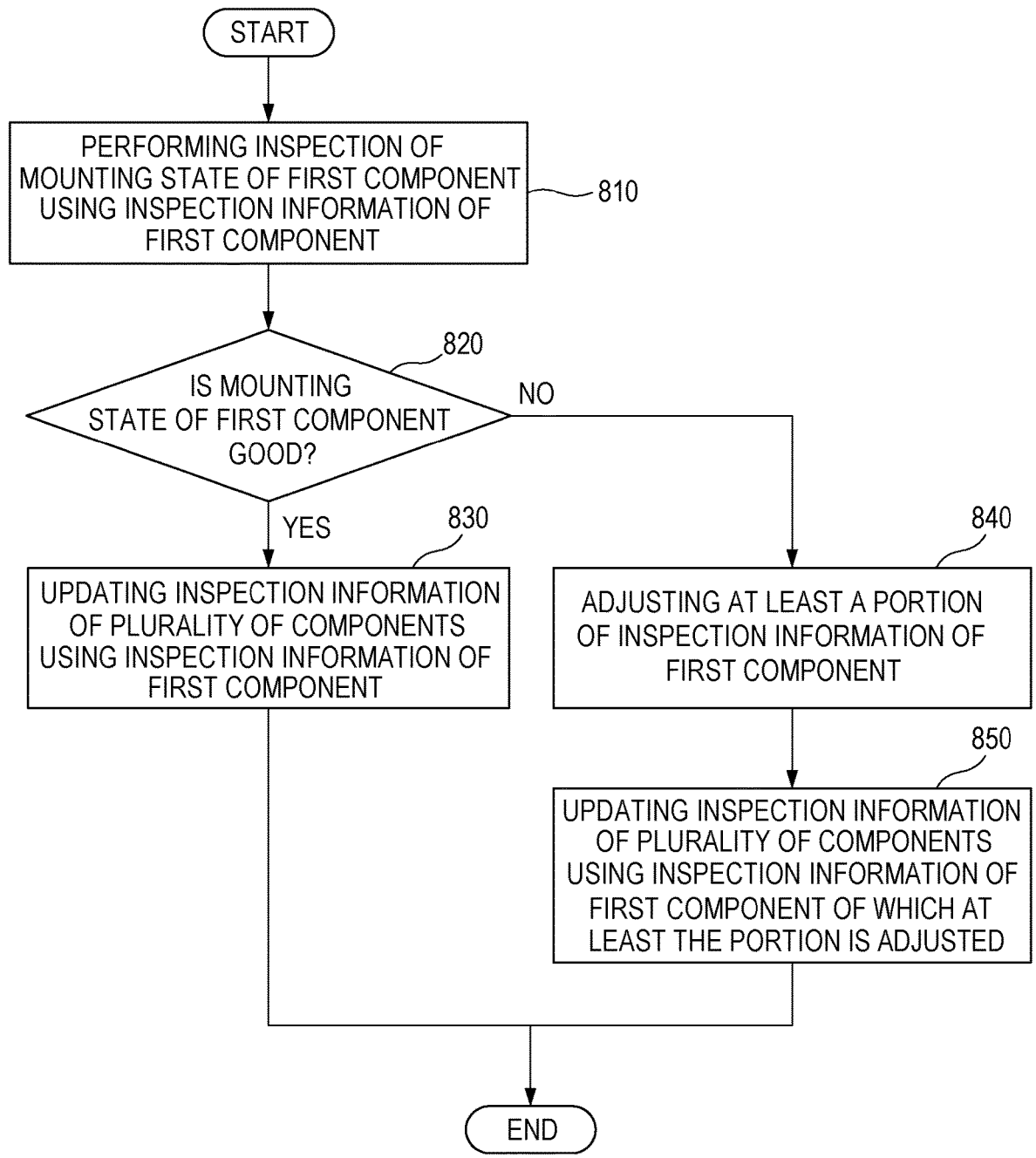

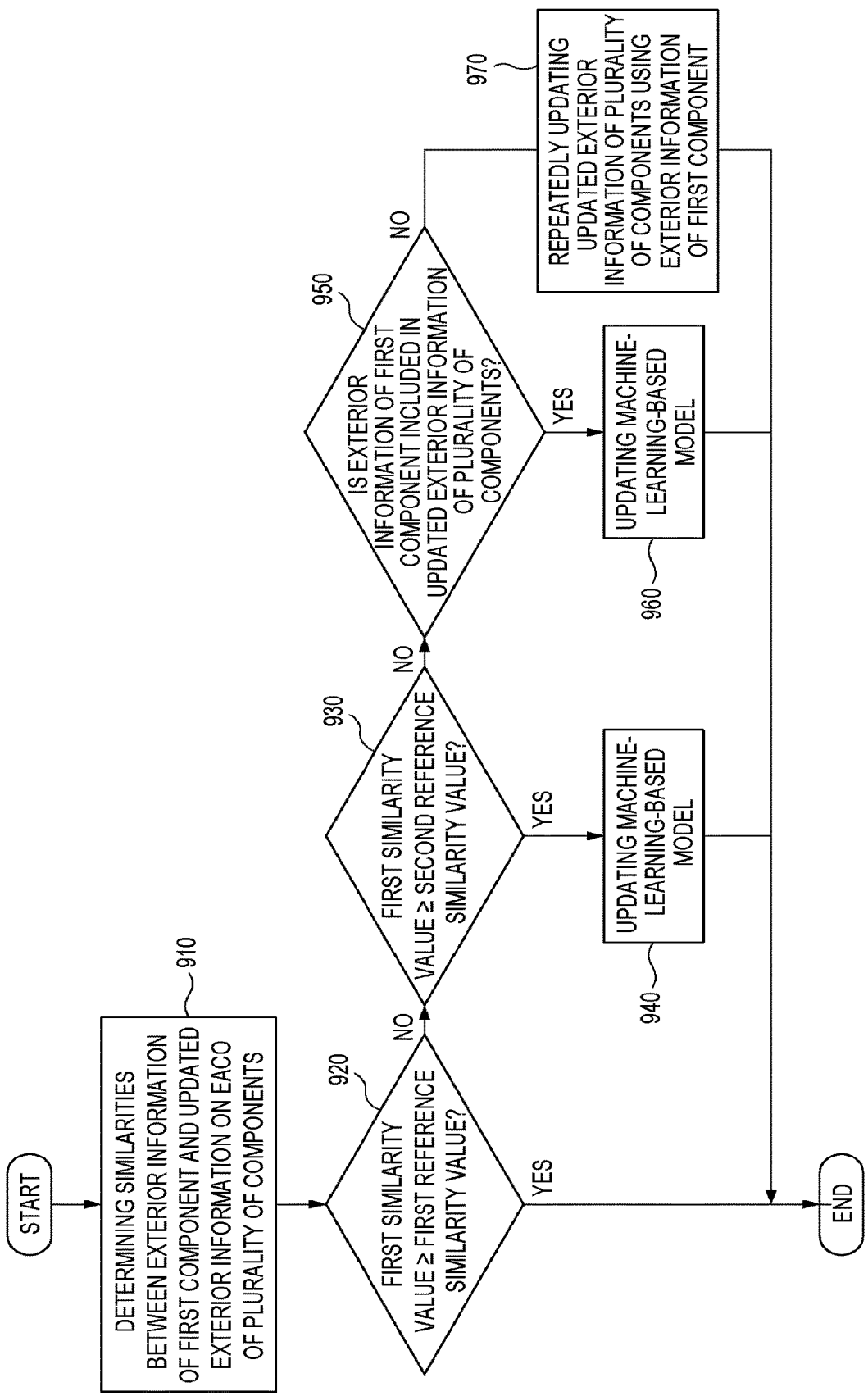

APPARATUS FOR INSPECTING COMPONENTS MOUNTED ON PRINTED CIRCUIT BOARD, OPERATING METHOD THEREOF, AND COMPUTER-READABLE RECORDING MEDIUM

CROSS-REFERENCE TO RELATED APPLICATION(S)

This application is based upon and claims the benefit of priority from Provisional Patent Application No. 62/458,166 filed on Feb. 13, 2017, the entire contents of which are incorporated herein by reference.

TECHNICAL FIELD

The present disclosure relates to an apparatus for inspecting components mounted on a printed circuit board, and more particularly, to an apparatus for inspecting a mounting state of components mounted on a printed circuit board.

BACKGROUND

In general, in a manufacturing process of a printed circuit board, a screen printer prints solder pastes on the printed circuit board, and a mounter mounts components on the printed circuit board on which the solder pastes are printed.

In addition, an automated optical inspection (AOI) device is used to inspect a mounting state of the components mounted on the printed circuit board. The AOI device uses an image of the printed circuit board to inspect whether the components are normally mounted on the printed circuit board without being displaced, warped, or tilted.

Meanwhile, in order for the AOI device to inspect a mounting state of each of the components, inspection information such as inspection items, inspection criteria, and the like are required. However, in recent years, the types of components mounted on a printed circuit board have been diversified and the degree of integration of the components has increased, whereas inspection information such as inspection items, inspection criteria, and the like for inspecting the mounting state of each of the components must be manually input by a user, and it takes a lot of time to inspect the mounting state of the components. In addition, when the user omits the input of the inspection information such as inspection items, inspection criteria, and the like for inspecting the mounting state of a specific component, the inspection of the mounting state of the specific component may not be performed properly.

SUMMARY

Various embodiments of the present disclosure may provide an apparatus for inspecting components which inspects the mounting state of components mounted on a printed circuit board, using the printed circuit board information, exterior information of a plurality of components, and inspection information of the plurality of components.

Various embodiments of the present disclosure may provide a computer-readable recording medium that records a program including executable instructions that cause an apparatus for inspecting components to inspect the mounting state of components mounted on a printed circuit board, using the printed circuit board information, exterior information of a plurality of components, and inspection information of the plurality of components.

Various embodiments of the present disclosure may provide an operating method of an apparatus for inspecting components that inspects the mounting state of components mounted on a printed circuit board, using the printed circuit board information, exterior information of a plurality of components, and inspection information of the plurality of components.

According to an embodiment of the present disclosure, an apparatus for inspecting a component mounted on a printed circuit board, the apparatus comprising: a memory configured to store printed circuit board information, exterior information of a plurality of components, and inspection information of the plurality of components used for inspection of a mounting state; an image sensor configured to obtain a two-dimensional (2D) image and a three-dimensional (3D) image of a first printed circuit board manufactured based on the printed circuit board information; and a processor configured to: determine exterior information of a first component using a first partial image of the 2D image and a second partial image of the 3D image corresponding to a first inspection region for inspection of a mounting state of the first component mounted on the first printed circuit board; determine whether a first similarity value is larger than or equal to a preset reference similarity value, the first similarity value being a largest value among similarities between the exterior information of the first component and the exterior information of each of the plurality of components, which are determined using the exterior information of the first component and the exterior information of the plurality of components; perform inspection of the mounting state of the first component using inspection information of a second component associated with exterior information of the second component having the first similarity value, among the inspection information of the plurality of components, when the first similarity value is larger than or equal to the reference similarity value, and update the inspection information of the plurality of components using inspection information of the first component matched with the inspection information of the second component, when it is determined that the mounting state of the first component is good from the inspection.

In one embodiment, the printed circuit board information includes information on mounting positions of the plurality of components with respect to the printed circuit board, information on printed positions of a plurality of solder pastes with respect to the printed circuit board, and information on bonding relationships between the plurality of components and the plurality of solder pastes.

In one embodiment, the exterior information of the plurality of components includes at least one of height information, area information, volume information, and position information of the plurality of components, information on at least one character printed on surfaces of the plurality of components, information on the number of a plurality of leads, thickness information of the plurality of leads, interval information between the plurality of leads, and position information of the plurality of leads.

In one embodiment, the inspection information of the plurality of components includes inspection item information indicating at least one inspection item used for inspection of mounting states of the plurality of components and inspection criteria information indicating an inspection criterion for each of the at least one inspection item.

In one embodiment, the processor is configured to determine the first inspection region using a mounting position of the first component with respect to the first printed circuit board determined based on the printed circuit board information.

In one embodiment, the memory is configured to store a machine-learning-based model trained to derive a similarity value between exterior information of two components, and the processor is configured to apply the exterior information of the plurality of components and the exterior information of the first component to the machine-learning-based model and determine the similarities between the exterior information of the first component and the exterior information of each of the plurality of components.

In one embodiment, the processor is configured to crop the first partial image and the second partial image corresponding to the first inspection region from the 2D image and the 3D image, and determine the exterior information of the first component using a feature point extracted from each of the first partial image and the second partial image.

In one embodiment, the processor is configured to: generate the inspection information of the first component when the first similarity value is less than the reference similarity value; perform the inspection of the mounting state of the first component using the generated inspection information of the first component; and update the inspection information of the plurality of components using the generated inspection information of the first component, when it is determined that the mounting state of the first component is good from the inspection.

In one embodiment, the processor is configured to: determine at least one inspection item used for the inspection of the mounting state of the first component based on the exterior information of the first component; determine an inspection criterion for the at least one inspection item using at least a portion of the inspection information of the second component and at least one of preset criteria; and generates the inspection information of the first component based on the determined at least one inspection item and the determined inspection criterion for the at least one inspection item.

In one embodiment, the processor is configured to: adjust at least a portion of the inspection information of the first component so that the mounting state of the first component is determined to be good, when it is determined that the mounting state of the first component is defective from the inspection; and update the inspection information of the plurality of components using the inspection information of the first component of which at least the portion is adjusted.

In one embodiment, the processor is configured to: adjust at least a portion of the inspection information of the second component so that the mounting state of the first component is determined to be good, when it is determined that the mounting state of the first component is defective from the inspection; and update the inspection information of the plurality of components using the inspection information of the first component matched with the inspection information of the second component of which at least the portion is adjusted.

In one embodiment, the memory stores a machine-learning-based model trained to derive a similarity value between exterior information of two components, and the processor updates the machine-learning-based model so that the first similarity value is less than the reference similarity value, when it is determined that the mounting state of the first component is defective from the inspection.

According to an embodiment of the present disclosure, a non-transitory computer-readable recording medium that records a program to be performed on a computer, wherein the program includes, when executed by a processor, executable instructions that cause the processor to perform operations of: obtaining a 2D image and a 3D image of a first printed circuit board manufactured based on printed circuit board information; determining exterior information of the first component using a first partial image of the 2D image and a second partial image of the 3D image corresponding to a first inspection region for inspection of a mounting state of the first component mounted on the first printed circuit board; determining whether a first similarity value is larger than or equal to a preset reference similarity value, the first similarity value being a largest value among similarities between the exterior information of the first component and the exterior information of each of a plurality of components, which are determined using the exterior information of the first component and the exterior information of the plurality of components; performing inspection of the mounting state of the first component using inspection information of a second component associated with exterior information of the second component having the first similarity value, among the inspection information of the plurality of components when the first similarity value is larger than or equal to the reference similarity value; and updating the inspection information of the plurality of components using inspection information of the first component matched with the inspection information of the second component, when it is determined that the mounting state of the first component is good from the inspection.

In one embodiment, the executable instructions cause the processor to further perform an operation of: determining the first inspection region for the inspection of the mounting state of the first component using a mounting position of the first component mounted on the first printed circuit board that is determined based on printed circuit board information.

In one embodiment, the executable instructions cause the processor to further perform operations of: generating the inspection information of the first component when the first similarity value is less than the reference similarity value; performing the inspection of the mounting state of the first component using the generated inspection information of the first component; and updating the inspection information of the plurality of components using the generated inspection information of the first component, when it is determined that the mounting state of the first component is good from the inspection.

In one embodiment, the executable instructions cause the processor to further perform operations of: adjusting at least a portion of the inspection information of the second component so that the mounting state of the first component is determined to be good, when it is determined that the mounting state of the first component is defective from the inspection; and updating the inspection information of the plurality of components using the inspection information of the first component matched with the inspection information of the second component of which the at least the portion is adjusted.

According to an embodiment of the present disclosure, an operating method of an apparatus for inspecting a component mounted on a printed circuit board, the operating method comprising: obtaining a 2D image and a 3D image of a first printed circuit board manufactured based on printed circuit board information; determining exterior information of a first component using a first partial image of the 2D image and a second partial image of the 3D image corresponding to a first inspection region for inspection of a mounting state of the first component mounted on the first printed circuit board; determining whether a first similarity value is larger than or equal to a preset reference similarity value, the first similarity value being a largest value, among similarities between the exterior information of the first component and the exterior information of each of a plurality of components which are determined using the exterior information of the first component and the exterior information of the plurality of components; performing inspection of the mounting state of the first component using inspection information of a second component associated with exterior information of the second component having the first similarity value, among inspection information of the plurality of components when the first similarity value is larger than or equal to the reference similarity value; and updating the inspection information of the plurality of components using inspection information of the first component matched with the inspection information of the second component when it is determined that the mounting state of the first component is good from the inspection.

An apparatus for inspecting components according to various embodiments of the present disclosure can be automatically set using at least one of stored inspection information of a plurality of components mounted on a printed circuit board when inspecting the mounting state of the plurality of components. In addition, the apparatus for inspecting components may use inspection information generated using at least one stored inspection information of components mounted on a printed circuit board, when inspecting the mounting state of the plurality of components. Thereby, it is not necessary for a user to input inspection information for inspecting the mounting state of all components one by one, and it is possible to prevent a problem that inspection is not properly performed due to omission of an input of information on a specific component.

BRIEF DESCRIPTION OF DRAWINGS

FIG. 2 is a flowchart illustrating an operating method of an apparatus for inspecting components according to various embodiments of the disclosure;

FIG. 3 is a flowchart illustrating a method of determining an inspection area by an apparatus for inspecting components according to various embodiments of the present disclosure;

FIG. 6 is a flowchart illustrating a method of generating inspection information of a first component by an apparatus for inspecting components according to various embodiments of the present disclosure.

FIG. 7 is a flowchart illustrating a method of updating inspection information of a plurality of components according to an inspection result of a first component by an apparatus for inspecting components according to various embodiments of the present disclosure.

FIG. 8 is a flowchart illustrating a method of updating information on a plurality of components using inspection information of a first component according to an inspection result of the first component by an apparatus for inspecting components according to various embodiments of the present disclosure.

FIG. 9 is a flowchart illustrating a method of updating a machine-learning-based model after generating inspection information of a first component by an apparatus for inspecting components according to various embodiments of the present disclosure.

DETAILED DESCRIPTION

Figure 1:
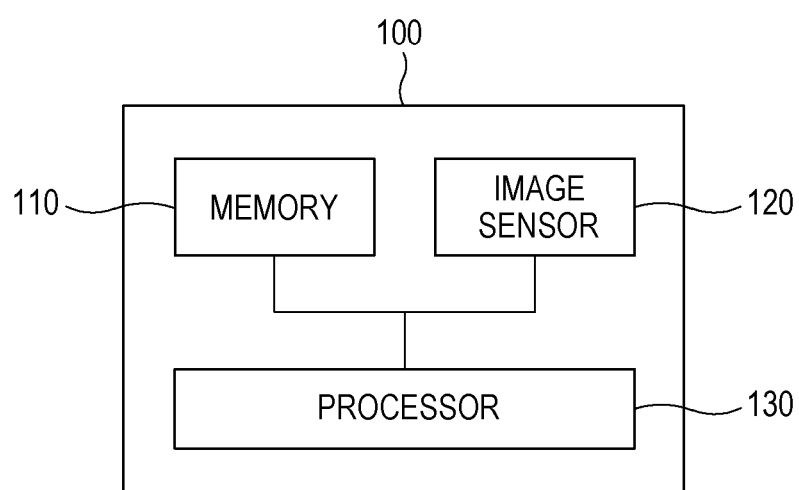
FIG. 1 is a block diagram illustrating an apparatus for inspecting components according to various embodiments of the present disclosure.

Embodiments of the present disclosure are illustrated for describing the technique of the present disclosure. The scope of the claims according to the present disclosure is not limited to the embodiments described below or to the detailed descriptions of these embodiments.

All technical or scientific terms used herein have meanings that are generally understood by a person having ordinary knowledge in the art to which the present disclosure pertains, unless otherwise specified. The terms used herein are selected for only more clear illustration of the present disclosure, and are not intended to limit the scope of claims according to the present disclosure.

The expressions "include", "provided with", "have" and the like used herein should be understood as open-ended terms connoting the possibility of inclusion of other embodiments, unless otherwise mentioned in a phrase or sentence including the expressions.

A singular expression may include meanings of plurality, unless otherwise mentioned, and the same is applied to a singular expression stated in the claims.

The terms "first", "second", etc. used herein are used to identify a plurality of components from one another, and are not intended to limit the order or importance of the relevant components.

The expression "based on" used herein is used to describe one or more factors that influences a decision, an action of judgment or an operation described in a phrase or sentence including the relevant expression, and this expression does not exclude additional factors influencing the decision, the action of judgment or the operation.

When a certain component is described as "coupled to" or "connected to" another component, this should be understood as having a meaning that the certain component may be coupled or connected directly to the other component or that the certain component may be coupled or connected to the other component via a new intervening component.

Hereinafter, embodiments of the present disclosure will be described with reference to the accompanying drawings. In the accompanying drawings, like or relevant components are indicated by like reference numerals. In the following description of embodiments, repeated descriptions of identical or relevant components will be omitted. However, even if a description of a component is omitted, such a component is not intended to be excluded in an embodiment.

FIG. 1 is a block diagram illustrating an apparatus for inspecting components according to various embodiments of the present disclosure.

According to various embodiments of the present disclosure, a component inspection apparatus 100 may include a memory 110, an image sensor 120, and a processor 130. The components included in the component inspection apparatus 100 may be electrically connected to each other via a bus (not illustrated) and may transmit and receive information, control messages, and the like to and from each other.

In one embodiment, the memory 110 may store instructions or data related to at least one other component of the component inspection apparatus 100. In addition, the memory 110 may store software and/or programs.

For example, the memory 110 may include an embedded memory or an external memory. The embedded memory may include, for example, at least one of a volatile memory (e.g., a DRAM, an SRAM, or an SDRAM) and a nonvolatile memory (e.g., a flash memory, a hard drive, or a solid state drive (SSD)). The external memory may be functionally or physically connected to the electronic device 100 via various interfaces.

In one embodiment, the memory 110 may store printed circuit board information, exterior information of a plurality of components mounted on a printed circuit board, and inspection information of the plurality of components used for inspection of the mounting state of the plurality of components. The printed circuit board information, the exterior information of the plurality of components, and the inspection information of the plurality of components may be received through a communication module (not illustrated) of the component inspection apparatus 100 or may be input through an input interface (not illustrated). The exterior information of the plurality of components and the inspection information of the plurality of components may be stored in the memory 110 so as to be associated with each other, respectively. For example, exterior information of a specific component may be stored in the memory 110 so as to be associated with inspection information of the specific component.

In addition, at least one of the printed circuit board information, the exterior information of the plurality of components, and the inspection information of the plurality of components may be stored in a memory of an electronic device (e.g., an external server or the like) that is wiredly or wirelessly interlocked with the component inspection apparatus 100. In this case, in order to inspect the mounting state of the plurality of components mounted on the printed circuit board, the component inspection apparatus 100 may transmit and receive at least one of the printed circuit board information, the exterior information of the plurality of component, and the inspection information of the plurality of components to and from the electronic device that is wiredly or wirelessly interlocked with the component inspection apparatus 100.

In one embodiment, the printed circuit board information may include information related to the manufacturing of the printed circuit board. The memory 110 may store various printed circuit board information for each type of the printed circuit board. For example, the printed circuit board information may include first information on the mounting position of each of the plurality of components with respect to the printed circuit board, second information on the printed position of a plurality of solder pastes with respect to the printed circuit board, and third information on the bonding relationship between the plurality of components and the plurality of solder pastes. Also, the memory 110 may store only the first information and the second information. In this case, the processor 120 may determine the third information using the first information and the second information.

For example, the third information on the bonding relationship between the plurality of components and the plurality of solder pastes may be information indicating which one of the plurality of solder pastes printed on the printed circuit board is bonded to a specific component. For example, the processor 120 may use the third information to determine that a first component mounted on the printed circuit board is bonded to a first solder paste to a third solder paste.

In addition, the processor 120 may use the first information to the third information to determine which solder paste is bonded to each of a plurality of leads of the first component. For example, the processor 120 may use the first information to the third information to determine that a first lead of the first component is bonded to the first solder paste, a second lead thereof is bonded to a second solder paste, and a third lead thereof is bonded to a third solder paste.

In one embodiment, the exterior information of the plurality of components includes at least one of height information of the plurality of components, area information (e.g., top surface area information of the plurality of components, etc.), volume information, position information, information on at least one character printed on the surface of the plurality of components, information on the number of the plurality of leads, thickness information of the plurality of leads, interval information between the plurality of leads, and position information of the plurality of leads. However, this is for illustrative purposes only and the present disclosure is not limited thereto. Various information related to the exterior of the plurality of components that can be measured using a two-dimensional (2D) image or a three-dimensional (3D) image with respect to the plurality of components can be used as the exterior information of the plurality of components.

In one embodiment, the inspection information of the plurality of components may be information used for inspecting the mounting state of the plurality of components. For example, the inspection information of the plurality of components may include inspection item information indicating at least one inspection item in the inspection of the mounting state of the plurality of components, and inspection criterion information indicating at least one inspection criterion for each inspection item.

For example, inspection item information on a specific component may be determined based on the exterior information of the specific component. For example, in a case where height information, area information, volume information, and thickness information of a plurality of leads are included in the exterior information of the specific component, when inspecting the mounting state of each of the plurality of components, at least one of the height, area, and volume of the components, and the thickness of the plurality of leads may be determined as an inspection item for inspecting the mounting state of the specific component, and may be stored as inspection item information of the specific component.

For example, the inspection criterion information may indicate information which is a criterion for determining whether the mounting state of the plurality of components is good or defective for each of at least one inspection item. For example, if height and area are determined as the inspection items, the inspection criterion information may include an inspection criterion for the height and an inspection criterion for the area. The processor 130 may perform inspection of the mounting state of the specific component by comparing the measured exterior information of the specific component with the respective inspection criteria for each inspection item. A specific method of generating the inspection criterion information will be described later.

In one embodiment, the image sensor 120 may obtain a 2D image and a 3D image of a first printed circuit board manufactured based on information on a printed circuit board which is stored in the memory 110. For example, the first printed circuit board may be a printed circuit board for which it is determined that the mounting state of a plurality of components mounted on the first printed circuit board is good.

For example, the 2D image of the first printed circuit board may be generated using light reflected by irradiating a plurality of monochromatic light illuminations to the first printed circuit board, and the 3D image of the first printed circuit board may be generated using light reflected by irradiating at least one grid pattern illumination to the first printed circuit board.

In FIG. 1, the image sensor 120 is illustrated to be included in the component inspection apparatus 100, but the present disclosure is not limited thereto. The image sensor 120 may be a separate component from the component inspection apparatus 100 and may be wiredly or wirelessly connected to the component inspection apparatus 100.

In one embodiment, the processor 130 may drive an operating system or an application program to control at least one other component of the component inspection apparatus 100 and may perform various data processing and operations. For example, the processor 120 may include a central processing unit or the like, and may be implemented as a system on chip (SoC).

In one embodiment, prior to performing inspection of the mounting state of the plurality of components mounted on the first printed circuit board manufactured based on information on the printed circuit board stored in the memory 110, the processor 130 may determine inspection information of at least one component to be used in the inspection of the mounting state of the plurality of components mounted on the first printed circuit board among the inspection information of the plurality of components stored in the memory 110, or may generate at least one inspection information.

In one embodiment, the processor 130 may obtain a 2D image and a 3D image of the first printed circuit board via the image sensor 120. As another example, the processor 130 may receive the 2D and 3D images of the first printed circuit board obtained via the image sensor of an external electronic device from the external electronic device through a communication circuit (not illustrated) of the component inspection apparatus 100.

Hereinafter, for convenience of description, a method of determining inspection information of the first component for the inspection of the mounting state of the first component mounted on the first printed circuit board among the inspection information of the plurality of components stored in the memory 110 or a method of generating the inspection information of the first component will be mainly described, but the present disclosure is not limited thereto. In the same manner, the processor 130 may determine inspection information of each of the plurality of components for the inspection of the mounting state for all of the plurality of components mounted on the first printed circuit board, or may generate inspection information of each of the plurality of components.

In one embodiment, the processor 130 may determine a first inspection region for inspection of the mounting state of the first component mounted on the first printed circuit board. For example, the processor 130 may determine the first inspection region using the mounting position of the first component with respect to the first printed circuit board, which is determined based on the printed circuit board information stored in the memory 110. A specific method of determining the first inspection region will be described later.

In one embodiment, the processor 130 may measure exterior information of the first component using a first partial image of the 2D image and a second partial image of the 3D image corresponding to the determined first inspection region. For example, the processor 130 may crop the first partial image and the second partial image corresponding to the first inspection region in the 2D image and the 3D image. The processor 130 may determine exterior information of the first component using a feature point extracted from each of the cropped first partial image and second partial image. For example, the processor 130 may measure at least one of the height, area, volume, and position of the first component, at least one character printed on the first component, the number of a plurality of leads, thickness of the plurality of leads, interval between the plurality of leads, and position of the plurality of leads using the feature points extracted from the first partial image and the second partial image, and may determine the exterior information of the first component using the measured results.

In one embodiment, the processor 130 may update the exterior information of the plurality of components stored in the memory 110 using the determined exterior information of the first component. For example, the processor 130 may update the exterior information of the plurality of components by adding the exterior information of the first component to the exterior information of the plurality of components stored in the memory 110. In this way, the exterior information of the updated plurality of components may include the determined exterior information of the first component.

In one embodiment, the processor 130 may determine similarities between the first component and each of the plurality of components by using the determined exterior information of the first component and the exterior information of the plurality of components stored in the memory 110. For example, the similarity value may be a value that indicates the degree of similarity value between two components, for example, an error score that numerically represents a difference between the exterior information of two components.

For example, the processor 130 may determine similarities between the first component and each of the plurality of components according to an algorithm that determines similarity value between predetermined two components. As another example, the processor 130 may use a machine-learning-based model trained to derive the similarity value between two components to determine the similarities between the first component and each of the plurality of components. The machine-learning-based model may be trained to derive the similarity value between two components using images of the components, exterior information of the components, etc., based on the algorithm that determines the similarity value between two components. For example, as the machine-learning-based model, a variety of machine-learning-based models such as a deep-running model, a convolution neural network (CNN), and the like may be used.

In one embodiment, the machine-learning-based model trained to derive the similarity value between the two components may be stored in the memory 110 or in a memory of an external electronic device that is wiredly or wirelessly interlocked with the component inspection apparatus 100. The processor 130 may apply the exterior information of the plurality of components and the exterior information of the first component to the machine-learning-based model to determine the similarities between the first component and each of the plurality of components.

For example, the machine-learning-based model may determine a difference between exterior information of a first plurality of components and the exterior information of the first component by comparing the exterior information of the first plurality of components with the exterior information of the first component. The machine-learning-based model may derive similarities between the first component and each of the plurality of components based on the determined difference.

For example, the machine-learning-based model may apply different weights according to the type of information included in the exterior information and may apply the applied weight to a difference between the exterior information of the first plurality of components and the exterior information of the first component to derive the similarities between the first component and each of the plurality of components. Hereinafter, for convenience of description, it is assumed that area information of a component, at least one character information printed on the surface of the component, and information on the number of a plurality of leads may be included in exterior information, and a higher weight is respectively applied in the order of the at least one character information printed on the surface of the component, the information on the number of the plurality of leads, and the area information of the component. In this case, the machine-learning-based model may derive a higher similarity value in the case where at least one character information is the same and the information on the number of the plurality of leads and the area information of the component is different, compared with a similarity value in the case where the at least one character information is different, and the information on the number of the plurality of leads and the area information of the component is the same. In this manner, the machine-learning-based model may apply the weight applied to the difference between the exterior information of the first plurality of components and the exterior information of the first component to derive the similarities between the first component and each of the plurality of components.

As described above, a method of deriving similarities between the first component and each of the plurality of components of the machine-learning-based model is for illustrative purposes only, and the present disclosure is not limited thereto. By training the machine-learning-based model in various ways, it is possible to derive the similarities between the first component and each of the plurality of components through the exterior information of the components.

In one embodiment, the processor 130 may determine whether a first similarity value having the largest value, among similarities between the determined exterior information of the first component and the exterior information of each of the plurality of components stored in the memory 110, is greater than or equal to a preset reference similarity value. Exterior information of a second component having a first similarity value may be exterior information that is determined to be most similar to the exterior information of the first component among the exterior information of the plurality of components. The processor 130 may use inspection information of the second component associated with the exterior information of the second component having the first similarity value when inspecting the mounting state of the first component by determining whether the first similarity value is greater than or equal to the reference similarity value.

For example, the reference similarity value may be a minimum similarity value determined to enable the inspection of the mounting state using the same inspection information. In a case in which the similarity value between the exterior information of the components is greater than or equal to the reference similarity value, the reference similarity value may be set in a manner such that inspection results of the mounting state of the components may correspond to the mounting state of actual components even when the inspection of the mounting state is performed using the same inspection information.

In one embodiment, when the first similarity value is greater than or equal to the reference similarity value, the processor 130 may perform inspection of the mounting state of the first component using the inspection information of the second component among the inspection information of the plurality of components stored in the memory 110. For example, the processor 130 may determine at least one inspection item information and at least one inspection item-specific inspection criterion when inspecting the mounting state of the first component based on the inspection information of the second component. The processor 130 may determine at least a portion of information corresponding to the determined at least one inspection item among the exterior information of the first component, and may compare the determined at least the portion of information with the at least one inspection item-specific inspection criterion. The processor 130 may inspect the mounting state of the first component based on the comparison result. For example, the processor 130 may inspect whether the mounting state of the first component is good or defective.

In one embodiment, when it is determined that the mounting state of the first component is good from the inspection of the mounting state of the first component, the processor 130 may generate inspection information of the first component so as to match the inspection information of the second component. In addition, the processor 130 may update the inspection information of the plurality of components stored in the memory 110 using the inspection information of the first component. For example, the processor 130 may update the inspection information of the plurality of components by adding the inspection information of the first component to the inspection information of the plurality of components. Thus, the updated inspection information of the plurality of components may include the inspection information of the first component.

In addition, the processor 130 may allow the exterior information of the first component to be associated with the inspection information of the second component without generating the inspection information of the first component so that the inspection information of the second component may be used in the inspection of the mounting state of the first component.

In one embodiment, when it is determined that the mounting state of the first component is defective from the inspection of the mounting state of the first component, the processor 130 may adjust at least a portion of the inspection information of the second component so that the mounting state of the first component may be determined to be good. For example, the processor 130 may adjust inspection criterion information included in the inspection information of the second component to allow the mounting state of the first component to be determined to be good in the inspection of the mounting state of the first component.

In addition, when it is determined that the mounting state of the first component is defective from the inspection of the mounting state of the first component, the processor 130 may update the machine-learning-based model so that the first similarity value is less than the reference similarity value. For example, when the result obtained by inspecting the mounting state using the inspection information of the second component associated with the exterior information of the second component having the first similarity value is different from the mounting state of actual components, the processor 130 may determine that the machine-learning-based model may not accurately derive the similarity value between the two components. Thus, the processor 130 may update the machine-learning-based model so that the machine-learning based model can more accurately derive the similarity value between the components. For example, the processor 130 may update the machine-learning-based model through a method such as adjusting different weights applied depending on the type of information included in the exterior information. This allows the machine-learning-based model to more accurately derive the similarity value between the two components.

In one embodiment, the processor 130 may repeatedly perform the inspection of the mounting state of the first component using the inspection information of the second component of which at least the portion is adjusted. When it is determined that the mounting state of the first component is good from the repeatedly performed inspection, the processor 130 may generate the inspection information of the first component so as to match the inspection information of the second component of which at least the portion is adjusted. In addition, the processor 130 may update the inspection information of the plurality of components stored in the memory 110 using the inspection information of the first component. For example, the processor 130 may update the inspection information of the plurality of components by adding the inspection information of the first component to the inspection information of the plurality of components. In this way, the updated inspection information of the plurality of components may include the inspection information of the first component.

In one embodiment, when the first similarity value is less than the reference similarity value, the processor 130 may generate the inspection information of the first component for inspecting the mounting state of the first component. When the first similarity value is less than the reference similarity value, the processor 130 may determine that there is no exterior information similar to the exterior information of the first component among the exterior information of the plurality of components, and may generate the inspection information of the first component. A specific method of generating the inspection information of the first component will be described later.

As described above, the component inspection apparatus 100 according to various embodiments of the present disclosure may determine inspection information of a component to be used for inspection of each of components mounted on a printed circuit board among inspection information of a plurality of components stored in the memory 110 or may generate inspection information of the component to be used for the inspection, prior to performing inspection of the mounting state of the plurality of components mounted on the printed circuit board. Thereby, in order for a user to perform inspection of the mounting state of the plurality of components mounted on the printed circuit board, it is possible to solve the inconvenience of having to input at least a portion of exterior information and inspection information of the plurality of components used for the inspection and to prevent a problem that inspection is not performed properly due to omission of at least one input of exterior information and inspection information of a specific component.

FIG. 2 is a flowchart illustrating an operating method of an apparatus for inspecting components according to various embodiments of the disclosure.

Although steps of processes, methods, algorithms, and the like are described in sequential order in the flowcharts illustrated in FIGS. 2, 3, 6, 7, 8, and 9, such processes, methods, and algorithms may be configured to operate in any suitable order. In other words, the steps of the processes, methods, and algorithms described in various embodiments of the present disclosure need not be performed in the order described in this disclosure. Also, although some of the steps are described as being performed asynchronously, some of these steps may be performed concurrently in other embodiments. Also, an illustration of a process by way of illustration in the drawings does not mean that it excludes other variations and modifications thereto, that any of the illustrated processes or steps thereof is necessary for one or more of the various embodiments of the present disclosure, or that the illustrated process is desired.

In operation 210, the component inspection apparatus 100 may obtain a 2D image and a 3D image of a first printed circuit board manufactured based on printed circuit board information stored in the memory 110. For example, the processor 130 may obtain the 2D image and the 3D image through the image sensor 120. As another example, the processor 130 may obtain the 2D image and the 3D image through an image sensor of an external electronic device through a communication module of the component inspection apparatus 100.

In operation 220, the component inspection apparatus 100 may determine exterior information of a first component by using a first partial image of the 2D image and a second partial image of the 3D image corresponding to a first inspection region. For example, the processor 130 may extract a feature point from each of the first partial image and the second partial image corresponding to the first inspection region cropped from the 2D image and the 3D image, and may determine the exterior information of the first component using the extracted feature points.

In operation 230, the component inspection apparatus 100 may determine whether a first similarity value having the largest value, among similarities between the exterior information of the first component and of the exterior information of each of the plurality of components stored in the memory 110 determined using the exterior information of the first component and the exterior information of the plurality of components stored in the memory 110, is greater than or equal to a preset reference similarity value. For example, the processor 130 may determine similarities between the exterior information of the first component and the exterior information of each of the plurality of components, using a machine-learning-based model trained to derive a similarity value in exterior information of two components.

In operation 240, when the first similarity value is greater than or equal to the reference similarity value, the component inspection apparatus 100 may perform inspection of the mounting state of the first component, using inspection information of a second component associated with exterior information of the second component having a first similarity value among the inspection information of the plurality of components stored in the memory 110. For example, the processor 130 may determine at least a portion of information corresponding to at least one inspection item determined based on the inspection information of the second component, among the exterior information of the first component, and may perform inspection of the mounting state of the first component by comparing the determined at least the portion of information with at least one inspection item-specific inspection criterion.

In operation 250, when it is determined that the mounting state of the first component is good from the inspection of the mounting state of the first component, the component inspection apparatus 100 may update the inspection information of the plurality of components stored in the memory 110 using the inspection information of the first component that matches the inspection information of the second component. In this way, the updated inspection information of the plurality of components may include the inspection information of the first component.

FIG. 3 is a flowchart illustrating a method of determining an inspection area by an apparatus for inspecting components according to various embodiments of the present disclosure.

In operation 310, the component inspection apparatus 100 may determine a mounting position of a first component with respect to a first printed circuit board, using printed circuit board information stored in the memory 110. For example, the processor 130 may determine mounting positions of a plurality of components including the first component mounted on the printed circuit board, using the printed circuit board information used for the manufacturing of the first printed circuit board.

Figure 4A:
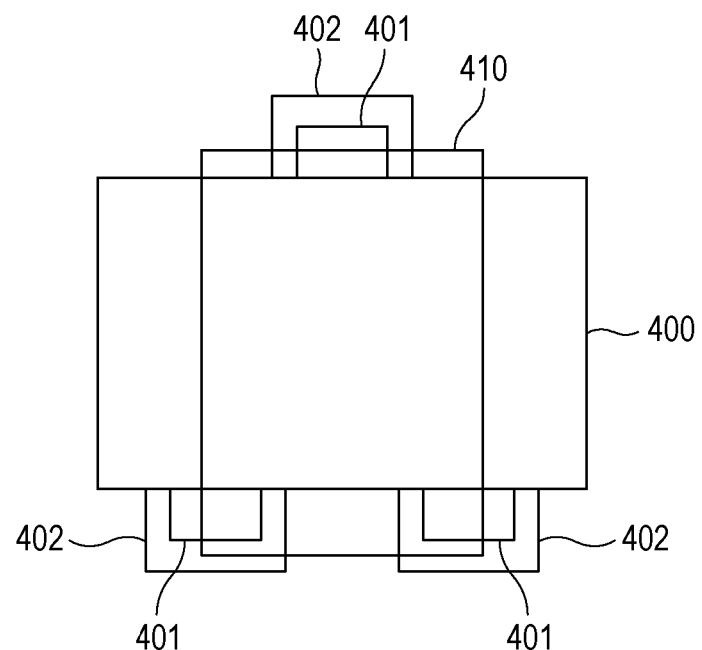
FIGS. 4A and 4B are diagrams illustrating a method of determining an inspection area by an apparatus for inspecting components according to various embodiments of the present disclosure.

In operation 320, the component inspection apparatus 100 may determine a first inspection region having a preset size with respect to a mounting position of the first component. For example, as illustrated in FIG. 4A, when the mounting position of a first component 400 with respect to the first printed circuit board is determined, the processor 130 may determine a first inspection region 410 having a preset size with respect to the mounting position of the first component (e.g., the position of the center point of the first component).

In operation 330, the component inspection apparatus 100 may use a 2D image of the first printed circuit board to determine whether a plurality of first solder pastes bonded to the first component are recognized. For example, as illustrated in FIG. 4A, the first component 400 may be bonded to the plurality of first solder pastes 402 through a plurality of leads 401. The processor 130 may determine whether the plurality of first solder pastes are recognized in the 2D image through exterior-related information such as shapes of the first component 400 and the plurality of first solder pastes 402 which are recognized through the 2D image, colors thereof, or the like.

In operation 331, when the plurality of first solder pastes are not recognized using the 2D image, the component inspection apparatus 100 may use the 3D image of the first printed circuit board to measure height information of the first component and the plurality of solder pastes. For example, when the plurality of first solder pastes are not recognized through the 2D image or when at least one solder paste among the plurality of first solder pastes is not recognized, the processor 130 may measure the height information of the first component and the plurality of solder pastes using the 3D image of the first printed circuit board.

In operation 332, the component inspection apparatus 100 may recognize the plurality of first solder pastes using the measured height information of the first component and the plurality of first solder pastes. Generally, since there is a difference in the height of the component and the solder paste bonded to the component, the processor 130 may recognize the plurality of first solder pastes using the measured height information of the first component and the height information of the plurality of first solder pastes.

In operation 340, when the plurality of first solder pastes are recognized using the 2D image, the component inspection apparatus 100 may determine whether the plurality of first solder pastes are included in the determined first inspection region. For example, since the plurality of first solder pastes should be included in the first inspection region to inspect the mounting state of the first component, the processor 130 may determine whether the plurality of first solder pastes are included in the first inspection region prior to finally determining the first inspection region. When the plurality of first solder pastes are included in the first inspection region, the processor 130 may finally determine the first inspection region having a preset size as an inspection region for inspecting the mounting state of the first component.

Figure 4B:
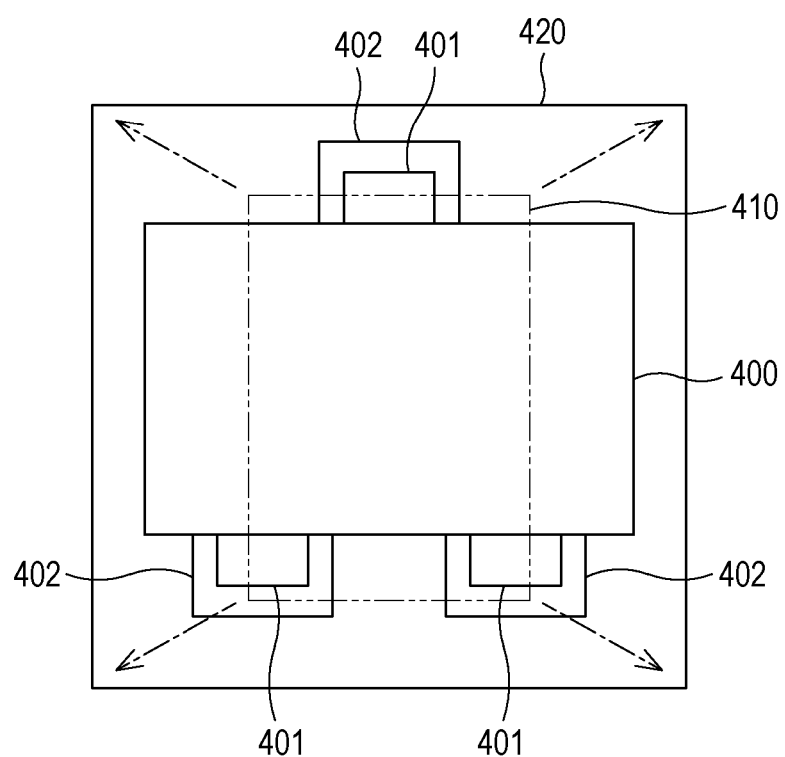

In operation 350, when the plurality of first solder pastes are not included in the first inspection region, the component inspection apparatus 100 may adjust the size of the first inspection region so that the plurality of first solder pastes are included in the first inspection region. For example, as illustrated in FIG. 4A, the plurality of first solder pastes 402 may not be included in the first inspection region 410 having a preset size. Since the plurality of first solder pastes 402 should also be included in the inspection region in order to inspect the mounting state of the first component 400, the processor 130 may adjust the size of the first inspection region 420 having a preset size as illustrated in FIG. 4B. The processor 130 may finally determine the first inspection region 420 whose size is adjusted as the inspection region for inspecting the mounting state of the first component.

Figure 5A:
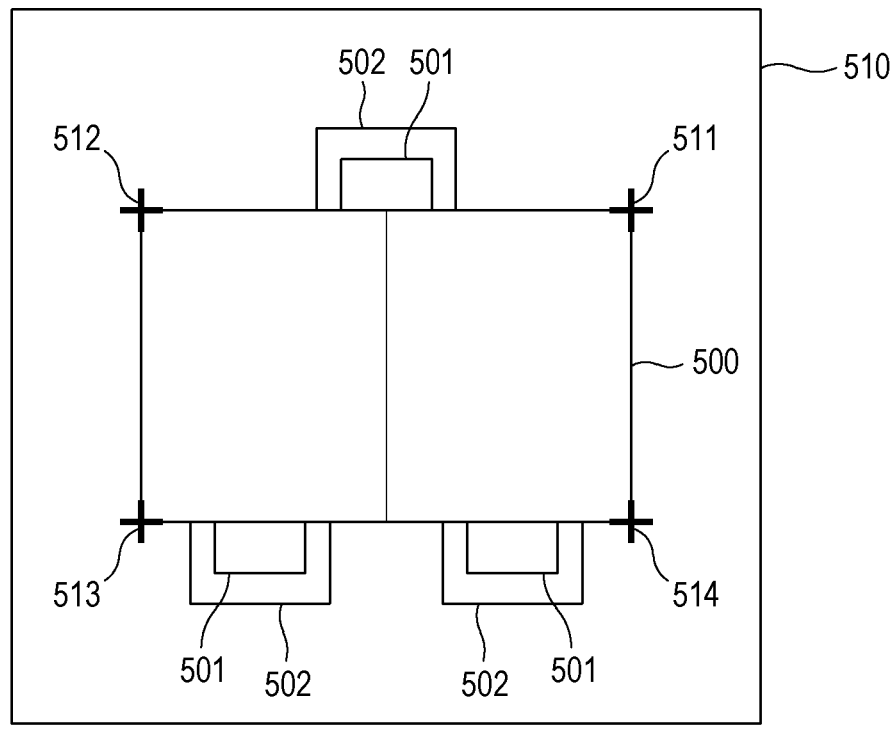
FIGS. 5A and 5B are diagrams illustrating a method of determining exterior information of components by an apparatus for inspecting components according to various embodiments of the present disclosure.
Figure 5B:
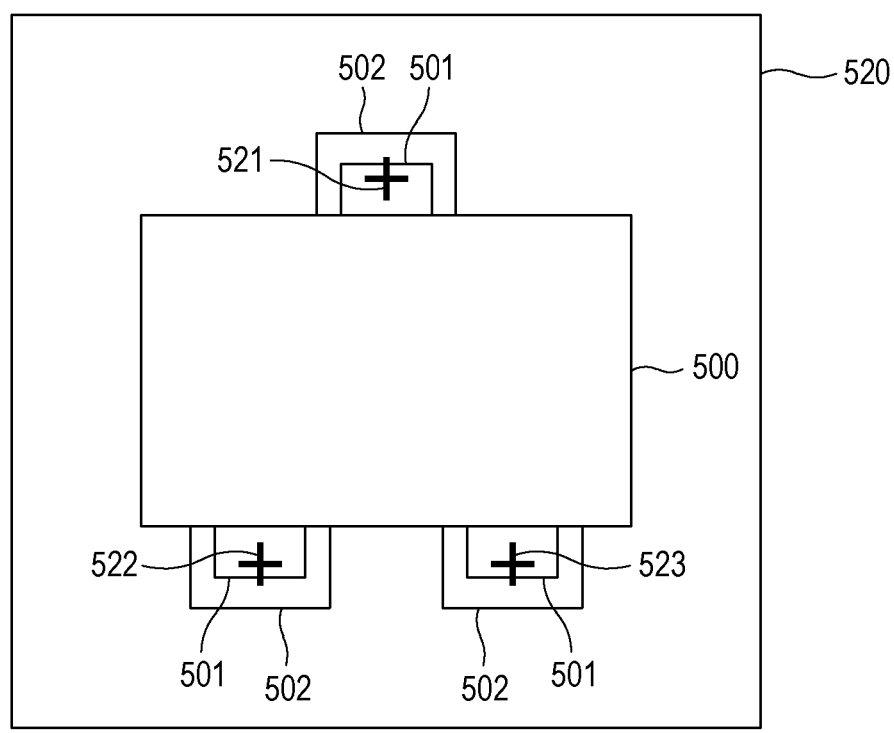

FIGS. 5A and 5B are diagrams illustrating a method of determining exterior information of components by an apparatus for inspecting components according to various embodiments of the present disclosure.

In one embodiment, the processor 130 of the component inspection apparatus 100 may determine a first inspection region for inspection of the mounting state of a first component mounted on a first printed circuit board, and may crop a first partial image and a second partial image corresponding to the first inspection region from a 2D image and a 3D image of the first printed circuit board.

FIGS. 5A and 5B illustrate the first partial image cropped from the 2D image. Hereinafter, a method of determining exterior information of the first component by extracting a feature point from the first partial image will be mainly described, but the present disclosure is not limited thereto. The feature point may be extracted even from the second partial image cropped from the 3D image and may be used to determine the exterior information of the first component.

As illustrated in FIG. 5A, the processor 130 may extract a plurality of feature points 511, 512, 513, and 514 associated with the first component from the first partial image. The processor 130 may measure at least one of the height, area, volume, and position of the first component using the extracted feature points 511, 512, 513, and 514. Also, although not illustrated, the processor 130 may recognize at least one character printed on the surface of the first component using at least one feature point to be extracted.

In addition, as illustrated in FIG. 5B, the processor 130 may extract a plurality of feature points 521, 522, and 523 associated with a plurality of leads of the first component from the first partial image. The processor 130 may use the extracted plurality of feature points 521, 522, and 523 to measure at least one of the number of the plurality of leads, the thickness of the plurality of leads, the interval between the plurality of leads, and the position of the plurality of leads.

In addition, although not illustrated, the processor 130 may extract a plurality of feature points associated with a plurality of first solder pastes bonded to the first component from the first partial image. The processor 130 may measure at least one of the height, area, volume, and position of the plurality of first solder pastes using the extracted plurality of feature points.

In one embodiment, the processor 130 may determine the exterior information of the first component using the measured information.

FIG. 6 is a flowchart illustrating a method of generating inspection information of a first component by an apparatus for inspecting components according to various embodiments of the present disclosure.

In operation 610, the component inspection apparatus 100 may determine at least one inspection item in inspection of the mounting state of a first component based on determined exterior information of the first component. For example, when a first similarity value having the largest value, among similarities between the exterior information of the first component and the exterior information of each of a plurality of components, is less than a preset reference similarity value, the processor 130 may generate inspection information of the first component in order to inspect the mounting state of the first component. The processor 130 may determine at least one inspection item to be inspected in the inspection of the mounting state of the first component according to the determined exterior information of the first component.

In operation 620, the component inspection apparatus 100 may determine an inspection criterion for each of the determined at least one inspection item, using at least a portion of inspection information of a second component associated with exterior information of the second component having a first similarity value and preset criteria. For example, the preset criteria may be Institute for Interconnecting and Packaging Electronic Circuits (IPC) standards. For example, the processor 130 may use at least the portion of the inspection information of the second component, even if the first similarity value is less than the reference similarity value. The processor 130 may determine at least the portion of the inspection information of the second component, which is to be used for determining the inspection criteria, based on a difference between the exterior information of the first component and the exterior information of the second component.

For example, the processor 130 may compare the exterior information of the first component and the exterior information of the second component and determine at least the portion of the exterior information of the first component, in which a difference with the exterior information of the second component is less than a preset threshold value, and may determine at least the portion of the inspection information of the second component associated with the determined at least the portion to use the determined at least the portion when determining the inspection criteria for each of the at least one inspection item. In addition, the processor 130 may further use a preset inspection criteria determination algorithm according to the type of information included in the exterior information in order to determine the inspection criteria for each of the at least one inspection item. Further, the processor 130 may further use inspection information of another component of the plurality of components, in which a difference with at least a portion of the exterior information of the first component is less than a preset threshold value, in order to generate the inspection information of the first component.

In operation 630, the component inspection apparatus 100 may generate the inspection information of the first component based on the determined at least one inspection item and the determined at least one inspection item-specific inspection criterion. When it is determined that the mounting state of the first component is good from the inspection of the mounting state of the first component which is performed using the generated inspection information of the first component, the processor 130 may update the inspection information of the plurality of components stored in the memory 110 using the inspection information of the first component. For example, the processor 130 may add the inspection information of the first component to the inspection information of the plurality of components to update the inspection information of the plurality of components. This allows the updated inspection information of the plurality of components to include the inspection information of the first component.

FIG. 7 is a flowchart illustrating a method of updating inspection information of a plurality of components according to an inspection result of a first component by an apparatus for inspecting components according to various embodiments of the present disclosure.

In operation 710, the component inspection apparatus 100 may perform inspection of the mounting state of a first component using inspection information of a second component associated with exterior information of the second component having a first similarity value. For example, when the first similarity value is greater than or equal to a reference similarity value, the processor 130 may perform inspection of the mounting state of the first component using inspection information of the second component.

In operation 720, the component inspection apparatus 100 may determine whether the mounting state of the first component is good from the inspection of the mounting state of the first component. For example, since a first printed circuit board is a printed circuit board for which it is determined that the mounting state of a plurality of components mounted on the first printed circuit board is good, the actual mounting state of the first component mounted on the first printed circuit board may be good. Accordingly, in inspection of the mounting state of the first component performed using inspection information of the second component, it should be determined that the mounting state of the first component on the first printed circuit board is good so that it is possible to determine that the inspection information of the second component can be used in the inspection of the mounting state of the first component.

In operation 721, when it is determined that the mounting state of the first component is good, the component inspection apparatus 100 may update the inspection information of the plurality of components stored in the memory 110 by using the inspection information of the first component matched with the inspection information of the second component. For example, when it is determined that the mounting state of the first component is good, the processor 130 may determine that the actual mounting state of the first component corresponds to the inspection result of the mounting state of the first component, so that it is possible to determine that the inspection information of the second component can be used in the inspection of the mounting state of the first component. Accordingly, the processor 130 may generate the inspection information of the first component so as to match the inspection information of the second component, and may use the inspection information of the first component to update the inspection of the plurality of components.

In addition, the processor 130 may allow the exterior information of the first component to be associated with the inspection information of the second component without generating the inspection information of the first component, so that the inspection information of the second component can be used for the inspection of the mounting state of the first component.

In operation 730, when it is determined that the mounting state of the first component is defective, the component inspection apparatus 100 may adjust at least a portion of the inspection information of the second component so that the mounting state of the first component should be determined to be good. For example, the processor 130 may adjust inspection criteria information included in the inspection information of the second component so that the mounting state of the first component can be determined to be good in the inspection of the mounting state of the first component.

In operation 740, the component inspection apparatus 100 may use the inspection information of the second component of which at least then portion is adjusted, to repeatedly perform the inspection of the mounting state of the first component.

In operation 750, when it is determined that the mounting state of the first component is good from the repeatedly performed inspection, the component inspection apparatus 100 may use the inspection information matching the inspection information of the second component of which at least the portion is adjusted, to update the inspection information of the plurality of components stored in the memory 110. For example, the processor 130 may generate the inspection information of the first component so as to match the inspection information of the second component of which at least the portion is adjusted, and may update the inspection information of the plurality of components using the inspection information of the first component.

FIG. 8 is a flowchart illustrating a method of updating information on a plurality of components using inspection information of a first component according to an inspection result of the first component by an apparatus for inspecting components according to various embodiments of the present disclosure.

In operation 810, the component inspection apparatus 100 may perform inspection of the mounting state of a first component, using generated inspection information of the first component. For example, when a first similarity value is less than a preset reference similarity value, the processor 130 may generate inspection information of the first component as described in FIG. 6, and then may repeatedly perform the inspection of the mounting state of the first component in a state in which the inspection information of the plurality of components stored in the memory 110 is updated.

In operation 820, the component inspection apparatus 100 may determine whether the mounting state of the first component is determined to be good from the inspection result obtained by repeatedly performing the inspection of the mounting state of the first component. For example, since a first printed circuit board is a printed circuit board for which it is determined that the mounting state of a plurality of components mounted on the first printed circuit board is good, the actual mounting state of the first component mounted on the first printed circuit board may be good. Accordingly, in the inspection of the mounting state of the first component performed using the generated inspection information of the first component, it should be determined that the mounting state of the first component is good so that the processor 130 may determine that the inspection information of the first component is generated properly.

In operation 830, when it is determined that the mounting state of the first component is good, the component inspection apparatus 100 may use the generated inspection information of the first component to update the inspection information of the plurality of components stored in the memory 110. For example, the processor 130 may update the inspection information of the plurality of components by adding the generated inspection information of the first component to the inspection information of the plurality of components stored in the memory 110.

In operation 840, when it is determined that the mounting state of the first component is defective, the component inspection apparatus 100 may adjust at least a portion of the inspection information of the first component so that the mounting state of the first component can be determined to be good. For example, the processor 130 may adjust inspection criteria information included in the inspection information of the first component so that the mounting state of the first component can be determined to be good in the inspection of the mounting state of the first component.

In operation 850, the component inspection apparatus 100 may update the inspection information of the plurality of components using the adjusted inspection information of the first component. For example, the processor 130 may repeatedly perform the inspection of the mounting state of the first component, using the adjusted inspection information of the first component. When it is determined that the mounting state of the first component is good from the repeatedly performed inspection, the processor 130 may update the inspection information of the plurality of components by adding the adjusted inspection information of the first component to the inspection information of the plurality of components. In addition, when it is determined that the mounting state of the first component is defective from the repeatedly performed inspection, the processor 130 may further adjust the adjusted inspection information of the first component so that the mounting state of the first component can be determined to be good.

FIG. 9 is a flowchart illustrating a method of updating a machine-learning-based model after generating inspection information of a first component by an apparatus for inspecting components according to various embodiments of the present disclosure.

In operation 910, the component inspection apparatus 100 may generate inspection information of a first component, and then may determine similarities between exterior information of the first component and exterior information of each of a plurality of components stored in the memory 110. Here, updated exterior information of the plurality components may be exterior information of the plurality of components updated using the exterior information of the first component.

In operation 920, the component inspection apparatus 100 may determine whether a first similarity value having the largest value, among the determined similarities between the exterior information of the first component and f exterior information of each of the plurality of components, is larger than or equal to a first reference similarity value. For example, the first reference similarity value may be a minimum similarity value determined to enable the inspection of the mounting state using the same inspection information. For example, when the first similarity value is larger than or equal to the first reference similarity value, the processor 130 may determine that the similarities between the exterior information of the first component and exterior information of each of the plurality of components are accurately derived, and may not update the machine-learning-based model.

In operation 930, when the first similarity value is less than the first reference similarity value, the component inspection apparatus 100 may determine whether the first similarity value is larger than or equal to a second reference similarity value. For example, the second reference similarity value may be a minimum value denoting that exterior information of each of the plurality components are not the same or similar so that the inspection of the mounting state can be performed using the same inspection information, but a portion of the inspection information can be determined to be usable in performing the inspection of the mounting state. For example, in order to determine whether the machine-learning-based model may accurately derive the similarities between the exterior information of the first component and the updated exterior information of each of the plurality of components after the exterior information of the plurality of components is updated using the exterior information of the first component, the processor 130 may determine whether the first similarity value is larger than or equal to the second reference similarity value.

In operation 940, when the first similarity value is larger than or equal to the second reference similarity value, the component inspection apparatus 100 may update the machine-learning-based model. When the first similarity value is less than the first reference similarity value and larger than or equal to the second reference similarity value although the updated exterior information of the plurality of components includes the exterior information of the first component, the processor 130 may determine that the machine-learning-based model cannot accurately derive the similarity value. Accordingly, the processor 130 may update the machine-learning-based model such that the first similarity value is derived to be larger than or equal to the first reference similarity value.

In operation 950, when the first similarity value is less than the second reference similarity value, the component inspection apparatus 100 may determine whether the exterior information of the first component is included in the updated exterior information of the plurality of components. For example, when the first similarity value is less than the second reference similarity value although the exterior information of the plurality of components is updated using the exterior information of the first component, the processor 130 may determine whether the exterior information of the first component is included in the updated exterior information of the plurality of components in order to determine whether a plurality of exterior information are properly updated using the exterior information of the first component.

In operation 960, the component inspection apparatus 100 may update the machine-learning-based model when the exterior information of the first component is included in the updated exterior information of the plurality of components. For example, when the first similarity value is less than the second reference similarity value although the exterior information of the plurality of components is updated using the exterior information of the first component, the processor 130 may determine that the machine-learning-based model cannot accurately derive the similarity value. Accordingly, the processor 130 may update the machine-learning-based model such that the first similarity value is derived to be larger than or equal to the first reference similarity value.

In operation 970, when the exterior information of the first component is not included in the updated exterior information of the plurality of components, the component inspection apparatus 100 may further update the updated exterior information of the plurality of components using the exterior information of the first component. For example, the processor 130 may further update the updated exterior information of the plurality of components by adding the exterior information of the first component to the updated exterior information of the plurality of components.

While the foregoing methods have been described with respect to particular embodiments, these methods may also be implemented as computer-readable codes on a computer-readable recording medium. The computer-readable recoding medium includes any kind of data storage devices that can be read by a computer system. Examples of the computer-readable recording medium includes ROM, RAM, CD-ROM, magnetic tape, floppy disk, optical data storage device and the like. Also, the computer-readable recoding medium can be distributed to computer systems which are connected through a network so that the computer-readable codes can be stored and executed in a distribution manner. Further, the functional programs, codes and code segments for implementing the foregoing embodiments can easily be inferred by programmers in the art to which the present disclosure pertains.

Although the technique of the present disclosure has been described by the examples described in some embodiments and illustrated in the accompanying drawings, it should be noted that various substitutions, modifications, and changes can be made without departing from the scope of the present disclosure which can be understood by those skilled in the art to which the present disclosure pertains. In addition, it should be noted that that such substitutions, modifications and changes are intended to fall within the scope of the appended claims.

What is claimed is:

1. An apparatus for inspecting a component mounted on a printed circuit board, the apparatus comprising:
   a memory configured to store printed circuit board information, exterior information of a plurality of components, and inspection information of the plurality of components used for inspection of a mounting state;
   an image sensor configured to obtain a two-dimensional (2D) image and a three-dimensional (3D) image of a first printed circuit board manufactured based on the printed circuit board information; and
   a processor configured to:
   determine exterior information of a first component using a first partial image of the 2D image and a second partial image of the 3D image corresponding to a first inspection region for inspection of a mounting state of the first component mounted on the first printed circuit board;
   determine whether a first similarity value is larger than or equal to a preset reference similarity value, the first similarity value being a largest value among similarities between the exterior information of the first component and the exterior information of each of the plurality of components, which are determined using the exterior information of the first component and the exterior information of the plurality of components;
   perform inspection of the mounting state of the first component using inspection information of a second component associated with exterior information of the second component having the first similarity value, among the inspection information of the plurality of components, when the first similarity value is larger than or equal to the reference similarity value, and update the inspection information of the plurality of components using inspection information of the first component matched with the inspection information of the second component, when it is determined that the mounting state of the first component is good from the inspection.

2. The apparatus of claim 1, wherein the printed circuit board information includes information on mounting positions of the plurality of components with respect to the printed circuit board, information on printed positions of a plurality of solder pastes with respect to the printed circuit board, and information on bonding relationships between the plurality of components and the plurality of solder pastes.

3. The apparatus of claim 1, wherein the exterior information of the plurality of components includes at least one of height information, area information, volume information, and position information of the plurality of components, information on at least one character printed on surfaces of the plurality of components, information on the number of a plurality of leads, thickness information of the plurality of leads, interval information between the plurality of leads, and position information of the plurality of leads.

4. The apparatus of claim 1, wherein the inspection information of the plurality of components includes inspection item information indicating at least one inspection item used for inspection of mounting states of the plurality of components and inspection criteria information indicating an inspection criterion for each of the at least one inspection item.

5. The apparatus of claim 1, wherein the processor is configured to determine the first inspection region using a mounting position of the first component with respect to the first printed circuit board determined based on the printed circuit board information.

6. The apparatus of claim 1, wherein the memory is configured to store a machine-learning-based model trained to derive a similarity value between exterior information of two components, and
the processor is configured to apply the exterior information of the plurality of components and the exterior information of the first component to the machine-learning-based model and determine the similarities between the exterior information of the first component and the exterior information of each of the plurality of components.

7. The apparatus of claim 1, wherein the processor is configured to crop the first partial image and the second partial image corresponding to the first inspection region from the 2D image and the 3D image, and determine the exterior information of the first component using a feature point extracted from each of the first partial image and the second partial image.

8. The apparatus of claim 1, wherein the processor is configured to:
generate the inspection information of the first component when the first similarity value is less than the reference similarity value;
perform the inspection of the mounting state of the first component using the generated inspection information of the first component; and
update the inspection information of the plurality of components using the generated inspection information of the first component, when it is determined that the mounting state of the first component is good from the inspection.

9. The apparatus of claim 8, wherein the processor is configured to:
determine at least one inspection item used for the inspection of the mounting state of the first component based on the exterior information of the first component;
determine an inspection criterion for the at least one inspection item using at least a portion of the inspection information of the second component and at least one of preset criteria; and
generate the inspection information of the first component based on the determined at least one inspection item and the determined inspection criterion for the at least one inspection item.

10. The apparatus of claim 8, wherein the processor is configured to:
adjust at least a portion of the inspection information of the first component so that the mounting state of the first component is determined to be good, when it is determined that the mounting state of the first component is defective from the inspection; and
update the inspection information of the plurality of components using the inspection information of the first component of which at least the portion is adjusted.

11. The apparatus of claim 1, wherein the processor is configured to:
adjust at least a portion of the inspection information of the second component so that the mounting state of the first component is determined to be good, when it is determined that the mounting state of the first component is defective from the inspection; and
update the inspection information of the plurality of components using the inspection information of the first component matched with the inspection information of the second component of which at least the portion is adjusted.

12. The apparatus of claim 1, wherein the memory stores a machine-learning-based model trained to derive a similarity value between exterior information of two components, and
the processor updates the machine-learning-based model so that the first similarity value is less than the reference similarity value, when it is determined that the mounting state of the first component is defective from the inspection.

13. A non-transitory computer-readable recording medium that records a program to be performed on a computer, wherein the program includes, when executed by a processor, executable instructions that cause the processor to perform operations of:
obtaining a 2D image and a 3D image of a first printed circuit board manufactured based on printed circuit board information;
determining exterior information of the first component using a first partial image of the 2D image and a second partial image of the 3D image corresponding to a first inspection region for inspection of a mounting state of the first component mounted on the first printed circuit board;
determining whether a first similarity value is larger than or equal to a preset reference similarity value, the first similarity value being a largest value among similarities between the exterior information of the first component and the exterior information of each of a plurality of components, which are determined using the exterior information of the first component and the exterior information of the plurality of components;

performing inspection of the mounting state of the first component using inspection information of a second component associated with exterior information of the second component having the first similarity value, among the inspection information of the plurality of components when the first similarity value is larger than or equal to the reference similarity value; and updating the inspection information of the plurality of components using inspection information of the first component matched with the inspection information of the second component, when it is determined that the mounting state of the first component is good from the inspection.

14. The computer-readable recording medium of claim 13, wherein the executable instructions cause the processor to further perform an operation of:

determining the first inspection region for the inspection of the mounting state of the first component using a mounting position of the first component mounted on the first printed circuit board that is determined based on printed circuit board information.

15. The computer-readable recording medium of claim 13, wherein the executable instructions cause the processor to further perform operations of:

generating the inspection information of the first component when the first similarity value is less than the reference similarity value;

performing the inspection of the mounting state of the first component using the generated inspection information of the first component; and updating the inspection information of the plurality of components using the generated inspection information of the first component, when it is determined that the mounting state of the first component is good from the inspection.

16. The computer-readable recording medium of claim 13, wherein the executable instructions cause the processor to further perform operations of:

adjusting at least a portion of the inspection information of the second component so that the mounting state of the first component is determined to be good, when it is determined that the mounting state of the first component is defective from the inspection; and updating the inspection information of the plurality of components using the inspection information of the first component matched with the inspection information of the second component of which the at least the portion is adjusted.

17. An operating method of an apparatus for inspecting a component mounted on a printed circuit board, the operating method comprising:

obtaining a 2D image and a 3D image of a first printed circuit board manufactured based on printed circuit board information;

determining exterior information of a first component using a first partial image of the 2D image and a second partial image of the 3D image corresponding to a first inspection region for inspection of a mounting state of the first component mounted on the first printed circuit board;

determining whether a first similarity value is larger than or equal to a preset reference similarity value, the first similarity value being a largest value, among similarities between the exterior information of the first component and the exterior information of each of a plurality of components which are determined using the exterior information of the first component and the exterior information of the plurality of components;

performing inspection of the mounting state of the first component using inspection information of a second component associated with exterior information of the second component having the first similarity value, among inspection information of the plurality of components when the first similarity value is larger than or equal to the reference similarity value; and updating the inspection information of the plurality of components using inspection information of the first component matched with the inspection information of the second component when it is determined that the mounting state of the first component is good from the inspection.

\* \* \* \* \*